US008884681B2

(12) United States Patent
Huang

(10) Patent No.: US 8,884,681 B2
(45) Date of Patent: Nov. 11, 2014

(54) GATE DRIVING DEVICES CAPABLE OF PROVIDING BI-DIRECTIONAL SCAN FUNCTIONALITY

(71) Applicant: InnoLux Corporation, Miao-Li County (TW)

(72) Inventor: Sheng-Feng Huang, Miao-Li County (TW)

(73) Assignee: Innolux Corporation, Miao-Li County (TW)

( * ) Notice: Subject to any disclaimer, the term of this patent is extended or adjusted under 35 U.S.C. 154(b) by 0 days.

(21) Appl. No.: 14/100,528

(22) Filed: Dec. 9, 2013

(65) Prior Publication Data

US 2014/0184304 A1 Jul. 3, 2014

(30) Foreign Application Priority Data

Dec. 27, 2012 (TW) ............................ 101150406 A

(51) Int. Cl.
*H03K 17/16* (2006.01)
*H03K 17/30* (2006.01)
*H03K 17/00* (2006.01)

(52) U.S. Cl.
CPC .............. *H03K 17/002* (2013.01); *H03K 17/16* (2013.01)
USPC ........................................ 327/379; 327/365

(58) Field of Classification Search
USPC ........................................ 327/365, 379, 551
See application file for complete search history.

(56) References Cited

U.S. PATENT DOCUMENTS

| | | | | | |
|---|---|---|---|---|---|
| 4,159,513 | A * | 6/1979 | Gemp et al. | | 363/43 |
| 6,870,524 | B2 * | 3/2005 | Katsutani | | 345/98 |
| 7,983,379 | B2 * | 7/2011 | Ieong et al. | | 377/64 |
| 7,986,761 | B2 * | 7/2011 | Ieong et al. | | 377/64 |
| 2008/0111773 | A1 * | 5/2008 | Tsuge | | 345/76 |
| 2008/0158133 | A1 * | 7/2008 | Ieong et al. | | 345/100 |
| 2008/0266234 | A1 * | 10/2008 | Ieong et al. | | 345/100 |
| 2009/0058787 | A1 * | 3/2009 | Weng et al. | | 345/98 |
| 2012/0268432 | A1 * | 10/2012 | Huang et al. | | 345/204 |
| 2013/0249876 | A1 * | 9/2013 | Huang et al. | | 345/205 |
| 2013/0257703 | A1 * | 10/2013 | Huang | | 345/100 |
| 2013/0265291 | A1 * | 10/2013 | Huang | | 345/212 |
| 2013/0314473 | A1 * | 11/2013 | Toyosawa et al. | | 347/61 |
| 2014/0184304 | A1 * | 7/2014 | Huang | | 327/379 |

* cited by examiner

*Primary Examiner* — Adam Houston
(74) *Attorney, Agent, or Firm* — McClure, Qualey & Rodack, LLP

(57) ABSTRACT

A gate driving device includes a gate driving unit, a first control unit, a second control unit and a switch unit. The first control unit includes an input terminal receiving a first output signal and a first clock input terminal receiving a first clock signal. The second control unit includes an input terminal receiving a second output signal and a first clock input terminal receiving a second clock signal. The switch unit, the first control unit and the second control unit are coupled to a carryout signal output node for generating a carryout signal at the carryout signal output node which indicates whether the gate driving unit is functioning correctly. The first output signal and the second output signal of the gate driving unit are respectively one signal generated by any two different stages of shift register in the gate driving unit.

20 Claims, 10 Drawing Sheets

GATE DRIVING DEVICES CAPABLE OF PROVIDING BI-DIRECTIONAL SCAN FUNCTIONALITY

CROSS REFERENCE TO RELATED APPLICATIONS

This application claims priority of Taiwan Patent Application No. 101150406, filed on Dec. 27, 2012, the entirety of which is incorporated by reference herein.

BACKGROUND OF THE INVENTION

1. Field of the Invention

The invention relates to a gate driving device, and more particularly to a gate driving device capable of providing bi-directional scan functionality without using of extra switches and control signals and generating conflict free carryout signal.

2. Description of the Related Art

Since monitors, comprising a rotating function, have become a trend, a gate driving device with bi-directional scan functionality is required therein. Generally, when the gate driving device finishes scanning in a predetermined direction, a carryout signal will be output for the system to determine whether the gate driving device is functioning normally. For example, a circuit designer may determine whether a carryout signal is output at a predetermined time and whether the carryout signal has predetermined waveforms, or the likes, so as to determine whether the gate driving device is functioning correctly.

Conventionally, gate driving devices capable of providing bi-directional scan functionality require extra switches and control signals for controlling the scan direction and outputting carryout signals. However, the extra switches and control signals usually increase the circuit cost and the complexity for controlling the circuit. When the extra switches and control signals are removed, undesired conflict will occur between pulses of the carryout signals.

Therefore, a novel gate driving device capable of providing bi-directional scan functionality without using extra switches and control signals and generating conflict free carryout signal is required.

BRIEF SUMMARY OF THE INVENTION

Gate driving devices are provided. An exemplary embodiment of a gate driving device comprises a gate driving unit, a first control unit, a second control unit and a switch unit. The gate driving unit comprises a bi-directional shift register circuit for generating a plurality of gate driving signals according to a start pulse to drive a plurality of pixels in a pixel array. The bi-directional shift register circuit comprises 1~N stages of shift registers coupled in serial. N is a positive integer. A first stage shift register generates a first output signal and an N-th stage shift register generates a second output signal. The first control unit is coupled to the gate driving unit and comprises an input terminal receiving the first output signal of the gate driving unit and a first clock input terminal receiving a first clock signal. The second control unit is coupled to the gate driving unit and comprises an input terminal receiving the second output signal of the gate driving unit and a first clock input terminal receiving a second clock signal. The switch unit is coupled to the first control unit and the second control unit at a carryout signal output node. The first control unit and the second control unit generate a carryout signal at the carryout signal output node according to the first output signal and the second output signal.

An exemplary embodiment of a gate driving device comprises a gate driving unit, a first control unit and a second control unit. The gate driving unit generates a plurality of gate driving signals according to a start pulse to drive a plurality of pixels in a pixel array. The gate driving unit comprises a first input terminal receiving the start pulse, a second input terminal receiving the start pulse, a first output terminal outputting a first output signal and a second output terminal outputting a second output signal. The first control unit comprises an input terminal coupled to the first output terminal of the gate driving unit for receiving the first output signal and a first clock input terminal for receiving a first clock signal. The second control unit comprises an input terminal coupled to the second output terminal of the gate driving unit for receiving the second output signal and a first clock input terminal for receiving a second clock signal. The first control unit and the second control unit are further coupled to a carryout signal output node and generate a carryout signal at the carryout signal output node according to the first output signal and the second output signal. When the gate driving unit outputs the gate driving signals in a first order, the first control unit generates the carryout signal according to the first clock signal during a first driving period, and the second control unit generates the carryout signal according to the second clock signal during a second driving period later than the first driving period.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
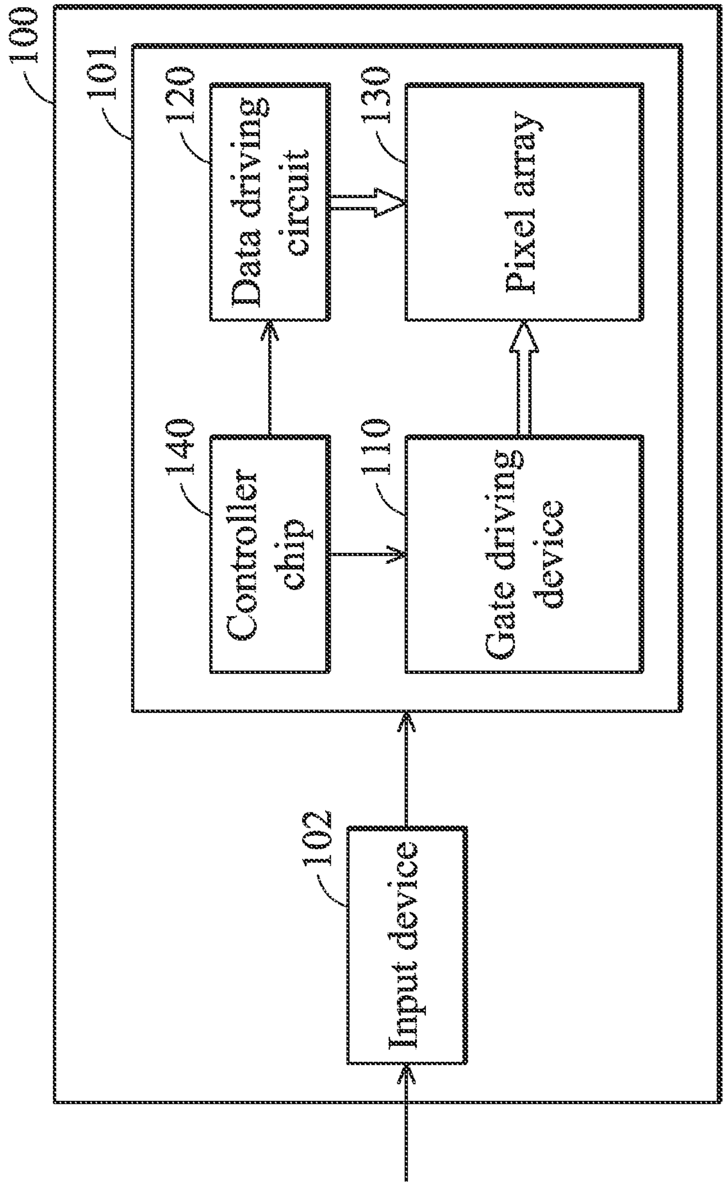
FIG. 1 shows one of the various types of image display systems of the disclosure according to an embodiment of the disclosure.

FIG. 1 shows one of the various types of image display systems of the disclosure according to an embodiment of the disclosure. As shown in FIG. 1, the image display system may comprise a display panel 101, where the display panel 101 may comprise a gate driving device 110, a data driving circuit 120, a pixel array 130 and a controller chip 140. The gate driving device 110 generates a plurality of gate driving signals to drive a plurality of pixels in the pixel array 130. The data driving circuit 120 generates a plurality of data driving signals to provide data to the pixels of the pixel array 130. The controller chip 140 generates a plurality of timing signals, comprising clock signals, reset signals and start pulses.

In addition, the image display system of the disclosure may further be comprised in an electronic device 100. The electronic device 100 may comprise the above-mentioned display panel 101 and an input device 102. The input device 102 receives image signals and controls the display panel 101 to display images. According to an embodiment of the disclosure, the electronic device 100 may be implemented as various devices, comprising: a mobile phone, a digital camera, a personal digital assistant (PDA), a lap-top computer, a personal computer, a television, an in-vehicle display, a portable DVD player, or any apparatus with image display functionality.

According to an embodiment of the invention, the gate driving device 110 may comprise a bi-directional shift register circuit capable of sequentially generating a corresponding gate driving signal to each gate line in different scan directions (for example, forward scan direction and reverse scan direction), so as to write the image signal provided to each data line to the pixels in the pixel array 130.

Figure 2:
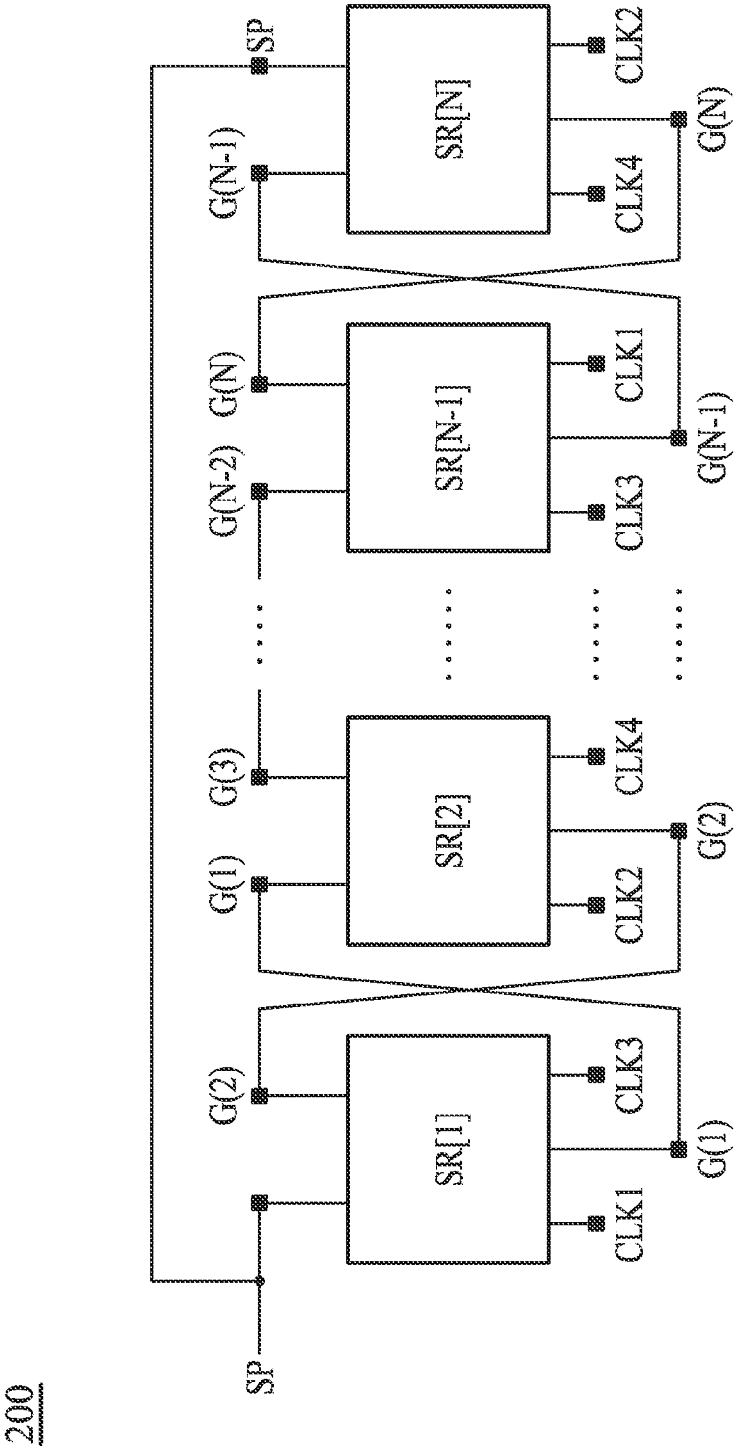
FIG. 2 shows a block diagram of a bi-directional shift register circuit according to an embodiment of the invention.

FIG. 2 shows a block diagram of a bi-directional shift register circuit according to an embodiment of the invention. The bi-directional shift register circuit 200 may comprise a plurality of stages of shift registers SR[1], SR[2], . . . SR[N−1] and SR[N] coupled in serial, each for generating one of the gate driving signals G(1)~G(N), where N is a positive integer.

During the forward scan, the shift registers SR[1]~SR[N] sequentially output the corresponding gate driving signals G(1)~G(N), and during the reverse scan, the shift registers SR[N]~SR[1] sequentially output the corresponding gate driving signals G(N)~G(1). Note that as compared with the conventional technique, in the bi-directional shift register circuit 200, there is no extra switches and control signals needed for controlling the scan direction. According to an embodiment of the invention, only by controlling the timing of the clock signals CLK1~CLK4, one scan direction may be distinguished from the other.

In addition, note that although the shift registers SR[1] and SR[N] receive the start pulse SP, simultaneously, by adequately controlling the timing of the clock signals CLK1~CLK4, during the forward scan, only the shift register SR[1] generates the corresponding gate driving signal G(1) in response to the start pulse SP and provides the gate driving signal G(1) to the next stage shift register SR[2]. Meanwhile, the shift register SR[N] does not generate the corresponding gate driving signal G(N) in response to the start pulse SP. Similarly, during the reverse scan, only the shift register SR[N] generates the corresponding gate driving signal G(N) in response to the start pulse SP and provides the gate driving signal G(N) to a next stage shift register SR[N−1]. Meanwhile, the shift register SR[1] does not generate the corresponding gate driving signal G(1) in response to the start pulse SP. Regarding the details of the bi-directional shift register circuit 200, reference may be made to the Taiwan Patent Application No. 101112183, filed on Apr. 6, 2012, and is omitted here for brevity.

Figure 3:
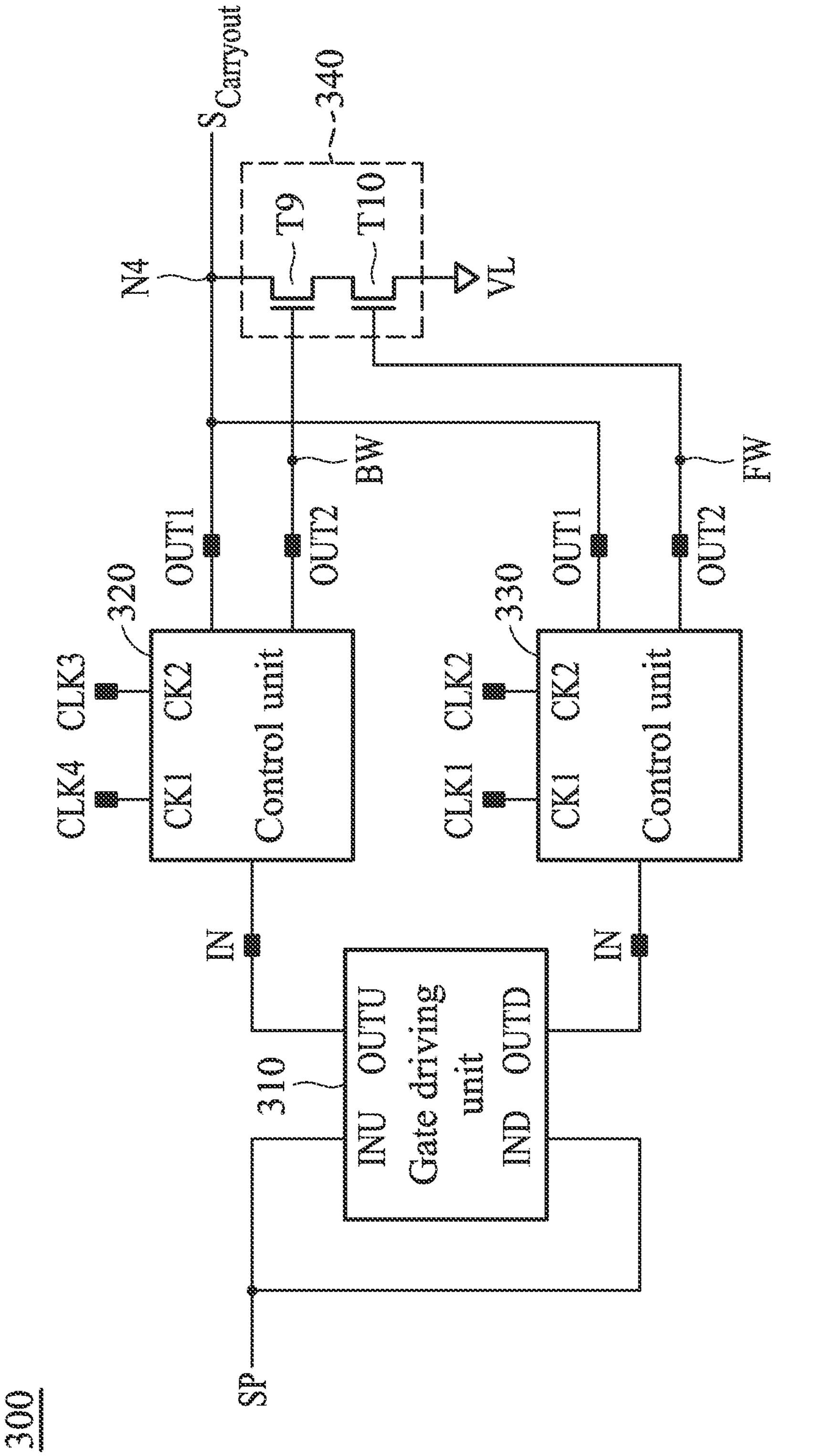
FIG. 3 shows a block diagram of a gate driving device according to an embodiment of the invention.

FIG. 3 shows a block diagram of a gate driving device according to an embodiment of the invention. The gate driving device 300 may comprise a gate driving unit 310, a first control unit 320, a second control unit 330 and a switch unit 340. The gate driving unit 310 may comprise a bi-directional shift register circuit, such as the bi-directional shift register circuit 200 shown in FIG. 2, for generating a plurality of gate driving signals according to the start pulse SP.

As shown in FIG. 3, the gate driving unit 310 may comprise two input terminals INU and IND for receiving the start pulse SP and two output terminals OUTU and OUTD for outputting a signal generated by any two different stages of shift registers in the bi-directional shift register circuit. For example, the output terminal OUTU may be coupled to a signal output node of the first stage shift register SR[1] and the OUTD may be coupled to a signal output node of the last stage shift register SR[N].

Note that the two output terminals OUTU and OUTD of the gate driving unit 310 are not limited to be coupled to the first stage shift register and the last stage shift register. According to other embodiments of the invention, the two output terminals OUTU and OUTD may be respectively coupled to the signal output nodes of any two different stages of shift registers.

According to an embodiment of the invention, the first control unit 320 and the second control unit 330 may have the same circuit structure, wherein each node in corresponding control units may receive different signals.

Figure 4:
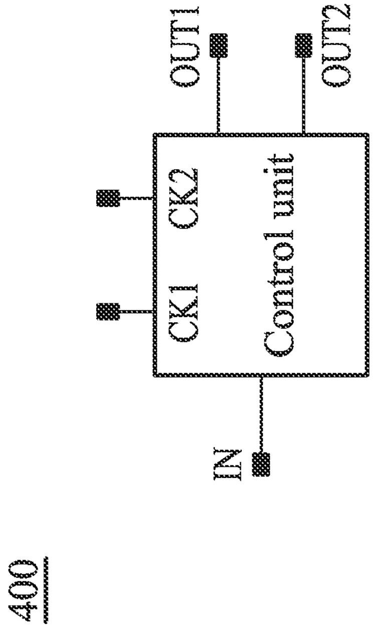
FIG. 4 shows an exemplary schematic diagram of a control unit according to an embodiment of the invention.

FIG. 4 shows an exemplary schematic diagram of a control unit according to an embodiment of the invention, where the control unit 400 may be either the first control unit 320 or the second control unit 330 in FIG. 3. The control unit 400 may comprise a signal input terminal IN, two clock input terminals CK1 and CK2 and two output terminals OUT1 and OUT2.

Referring back to FIG. 3, the input terminal IN of the first control unit 320 is coupled to the output terminal OUTU of the gate driving unit 310 for receiving a first output signal of the gate driving unit 310. The clock input terminal CK1 of the first control unit 320 receives the clock signal CLK4 and the clock input terminal CK2 of the first control unit 320 receives the clock signal CLK3. In addition, the output terminal OUT1 of the first control unit 320 is coupled to a carryout signal output node N4 and the output terminal OUT2 of the first control unit 320 is coupled to a control node BW.

The input terminal IN of the second control unit 330 is coupled to the output terminal OUTD of the gate driving unit 310 for receiving a second output signal of the gate driving unit 310, the clock input terminal CK1 of the second control unit 330 receives the clock signal CLK1 and the clock input terminal CK2 of the second control unit 330 receives the clock signal CLK2. In addition, the output terminal OUT1 of the second control unit 330 is coupled to a carryout signal output node N4 and the output terminal OUT2 of the second control unit 330 is coupled to a control node FW.

According to a preferred embodiment of the invention, the first output signal of the gate driving unit 310 may be the gate driving signal G(1) generated by the first stage shift register SR[1] and the second output signal of the gate driving unit 310 may be the gate driving signal G(N) generated by the last stage shift register SR[N]. However, note that the first output signal and second output signal of the gate driving unit 310 are not limited to be the gate driving signals G(1) and G(N). As discussed above, the first output signal and second output signal may be a signal generated by any two different stages of shift registers. To clearly illustrate the invention concept, the gate driving signals G(1) and G(N) are utilized in the following embodiments as the first output signal and the second output signal of the gate driving unit 310. However, note that the invention should not be limited thereto.

According to an embodiment of the invention, the switch unit 340, the first control unit 320 and the second control unit 330 are coupled to the carryout signal output node N4 for generating the carryout signal $S_{CarryOut}$ at the carryout signal output node N4. As described above, for example, a circuit designer may determine whether the carryout signal is output at a predetermined time and whether the carryout signal has predetermined waveforms, or the likes, so as to determine whether the gate driving device us functioning correctly.

The switch unit 340 may comprise two switches coupled in serial, such as the transistors T9 and T10 coupled in serial between the carryout signal output node N4 and the supply voltage VL. The transistor T9 is coupled to the control node BW and switches on or off in response to a voltage at the control node BW. The transistor T10 is coupled to the control node FW and switches on or off in response to a voltage at the control node FW. Note that in the embodiments of the invention, the transistors T9 and T10 are not limited to NMOS transistors, and may also be PMOS transistors or other switch devices capable of switching on or off in response to a voltage level of a received control signal.

Figure 5:
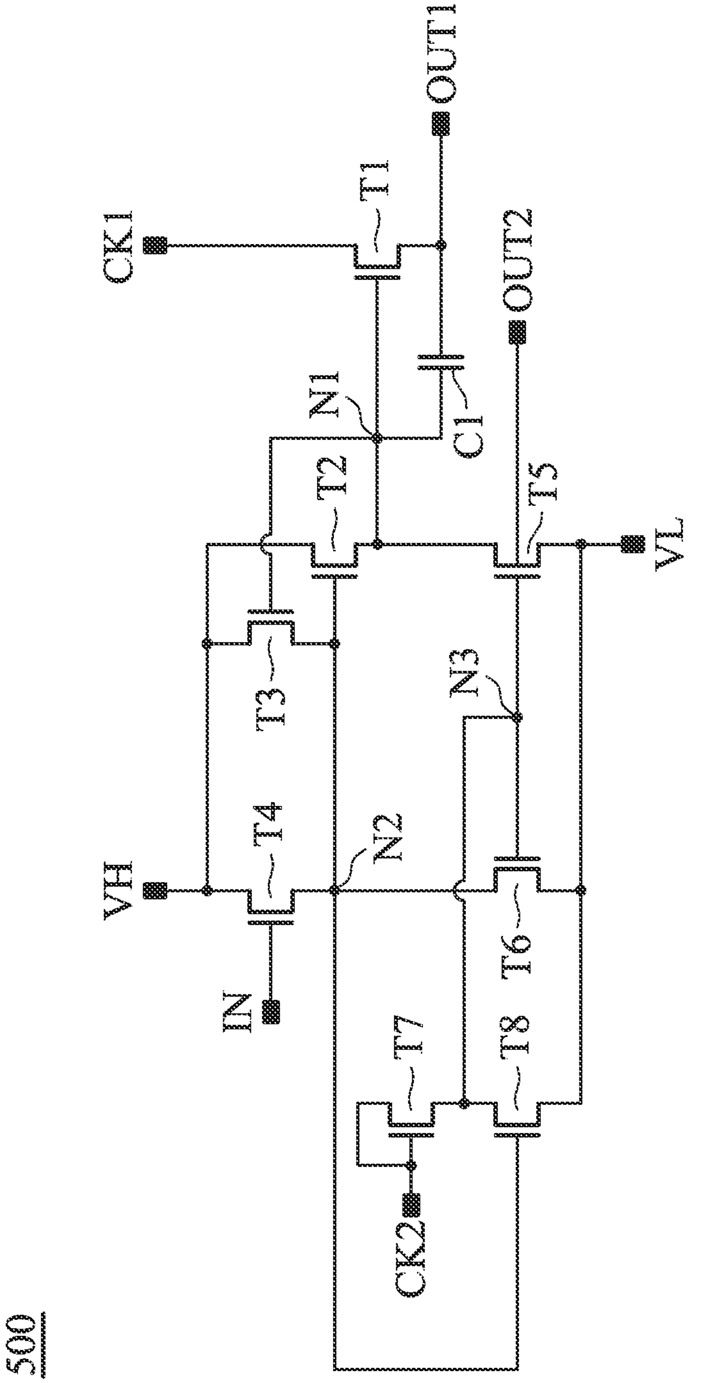
FIG. 5 shows a circuit diagram of a control unit according to an embodiment of the invention.

FIG. 5 shows a circuit diagram of a control unit according to an embodiment of the invention, where the control unit 500 may be either the first control unit 320 and/or the second control unit 330 in FIG. 3. The control unit 500 may comprise transistors T1~T10 and a capacitor C1. The transistor T1 is coupled between the clock input terminal CK1 and the output terminal OUT1. The transistor T2 is coupled to the transistor T1 at node N1 and is further coupled to the supply voltage VH. The transistor T3 is coupled to the transistor T1 at node N1, coupled to the transistor T2 at the node N2, and is further coupled to the supply voltage VH. The transistor T4 is coupled to the transistor T2 at the node N2 and is further coupled to the supply voltage VH and the input terminal IN. The transistor T5 is coupled to the transistor T2 at the node N1 and is further coupled to the supply voltage VL and the output terminal OUT2. The transistor T6 is coupled between the node N2 and the supply voltage VL. The transistors T7 and T8 are coupled in serial between the clock input terminal CK2 and the supply voltage VL. According to an embodiment of the invention, the supply voltage VH has a high voltage level and the supply voltage VL has a low voltage level.

Figure 7:
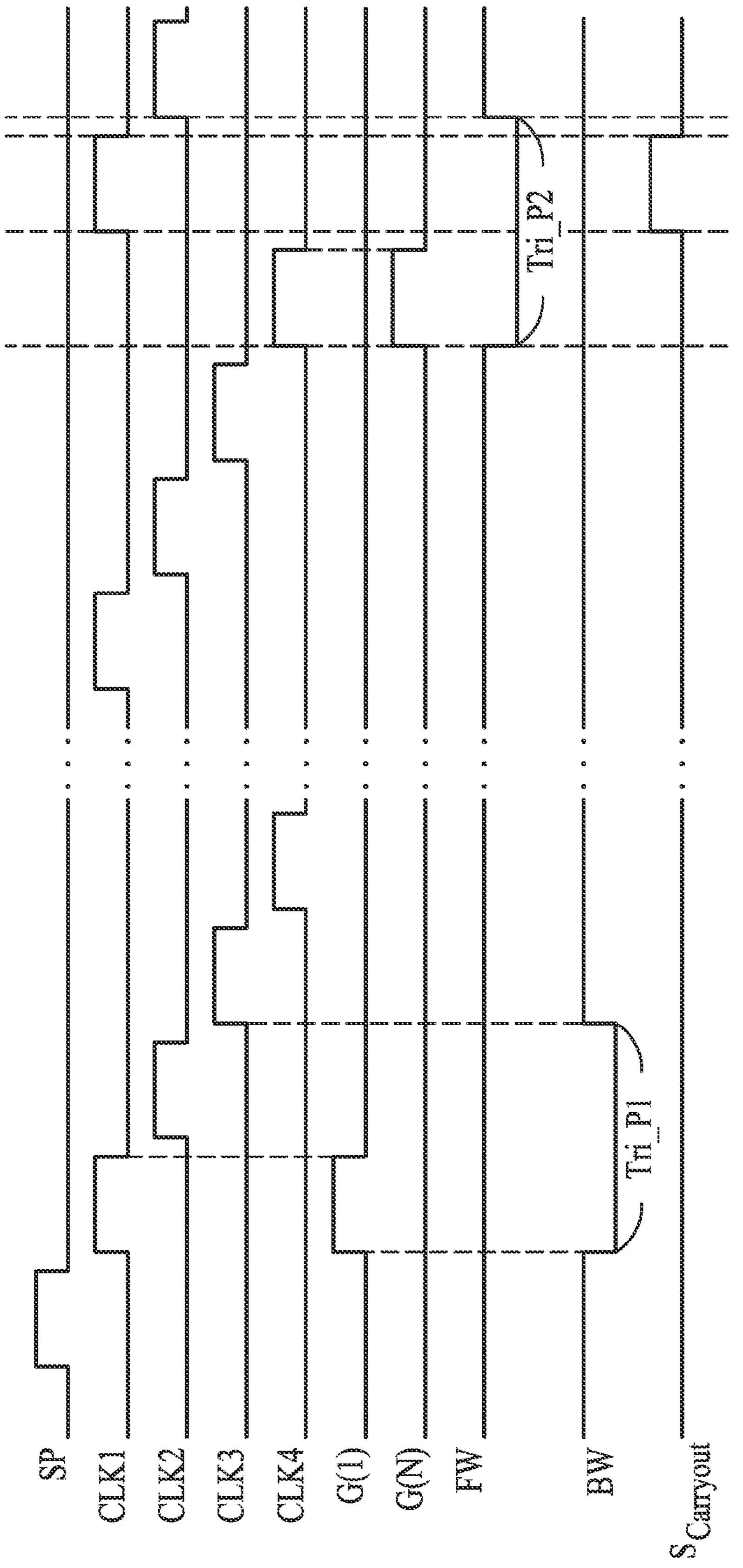
FIG. 7 shows signal waveforms of the gate driving device in forward scan according to an embodiment of the invention.
Figure 8:
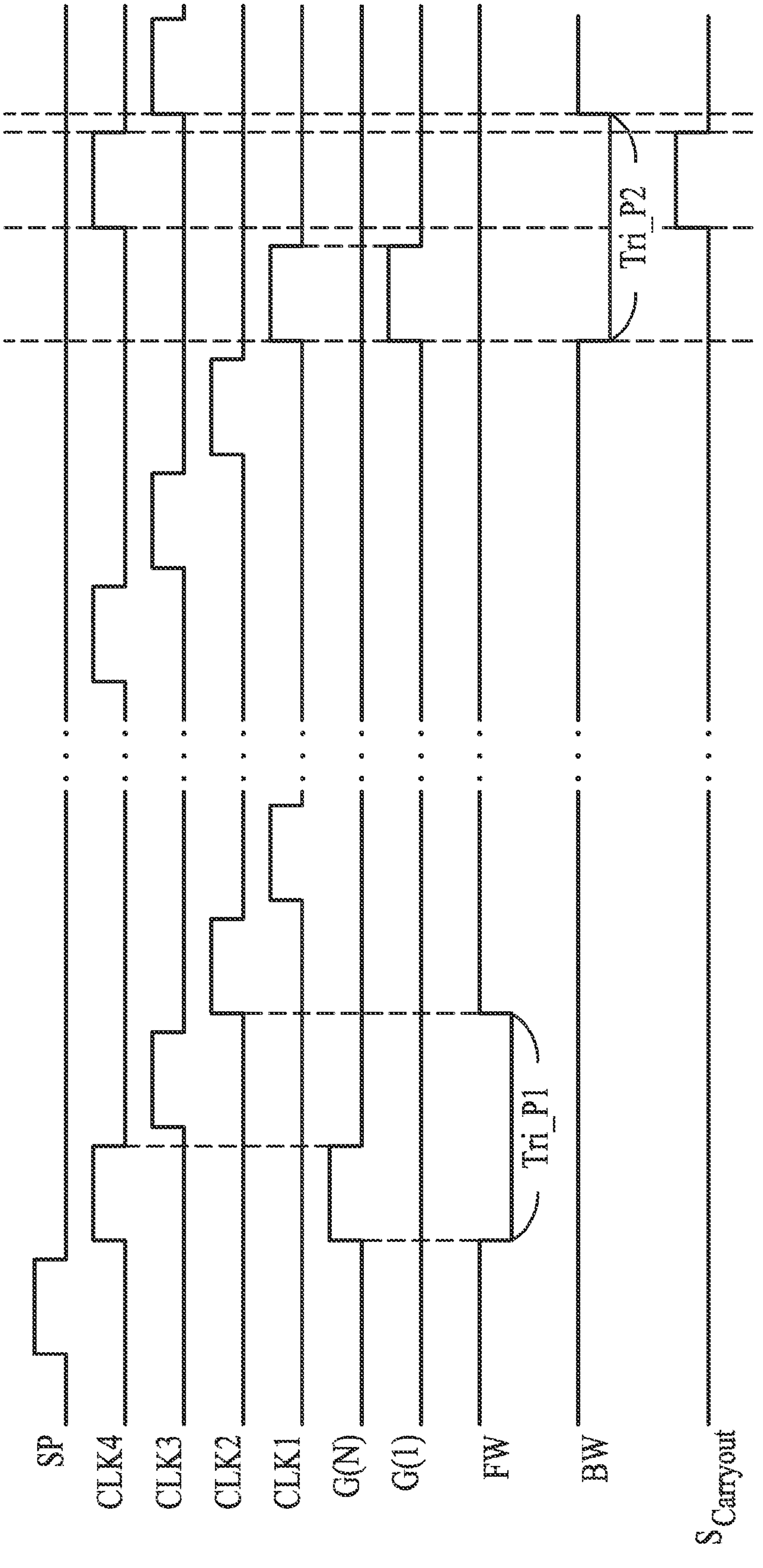
FIG. 8 shows signal waveforms of the gate driving device in reverse scan according to an embodiment of the invention.

FIG. 7 shows signal waveforms of the gate driving device in forward scan according to an embodiment of the invention. FIG. 8 shows signal waveforms of the gate driving device in reverse scan according to an embodiment of the invention. Referring to the embodiments shown in FIG. 3, FIG. 5, FIG. 7 and FIG. 8, operations of the proposed gate driving device will be discussed in more detail in the following paragraphs. To clearly illustrate the invention concept, the gate driving signals G(1) and G(N) are utilized in the following embodiments as the first output signal and the second output signal of the gate driving unit 310. However, note that the invention should not be limited thereto.

According to an embodiment of the invention, before the input terminal IN of the control unit receives a pulse, the transistor T1 is turned off. Thus, the output terminal OUT1 has high impedance and the output terminal OUT2 is at a high voltage level. This is because the transistor T7 in FIG. 5 is turned on periodically in response to the clock signal received at the clock input terminal CK2. When the transistor T7 is turned on, the node N3 and the output terminal OUT2 are at a high voltage level, therefore turning on the transistors T5 and T6. In addition, before the input terminal IN of the control unit receives a pulse, the transistor T4 is turned off and the node N2 remains at a low voltage level since the transistor T6 is turned on. Therefore, the transistor T8 is turned off and the node N3 remains at a high voltage level. Similarly, when the transistor T4 is turned off, the transistor T1, T2 and T3 are turned off. Thus, the output terminal OUT1 has high impedance.

In other words, during the initial state of the control unit 500 and before the transistor T1 is turned on, the nodes N1 and N2 of the control unit 500 are at a low voltage level, the output terminal OUT 1 has high impedance, and the node N3 and the output terminal OUT2 are at a high voltage level. In addition, referring to FIG. 3, when both the output terminal OUT2 of the first control unit 320 and the second control unit 330 are at a high voltage level, the control nodes BW and FW both are at a high voltage level. Therefore, the transistors T9 and T10 in the switch unit 340 are simultaneously turned on, such that the carryout signal output node N4 is electronically coupled to the supply voltage VL and the carryout signal $S_{CarryOut}$ is at a low voltage level.

When a pulse of the gate driving signal G(1) arrives, the transistor T4 of the first control unit 310 is turned on and the first driving period Tri_P1 begins. When the transistor T4 is turned on, a voltage at the node N 2 is pulled high to a high voltage level approaching the supply voltage VH. The transistors T2 and T8 are therefore turned on. Next, a voltage at the node N1 is also pulled high to a high voltage level approaching the supply voltage VH. The transistors T1 and T3 are therefore turned on. Meanwhile, voltages at the node N3 and the output terminal OUT2 are pulled low to a low voltage level approaching the supply voltage VL due to the turning on of the transistor T8, and the transistors T5 and T6 are turned off.

Since the control unit receiving the gate driving signal G(1) is the first control unit 320, the output terminal OUT2 thereof is coupled to the node BW. Therefore, as shown in FIG. 7, during the first driving period Tri_P1, the voltage level at the node BW is pulled low to a low voltage level.

When the transistor T1 of the first control unit 320 is turned on, the clock signal received at the clock input terminal CK1 is output to the output terminal OUT1 as the carryout signal $S_{CarryOut}$. As shown in FIG. 3, the clock signal received at the clock input terminal CK1 of the first control unit 320 is CLK4. Note that since the clock signal CLK4 is designed not to have a pulse during the first driving period Tri_P1, the voltage level of the carryout signal $S_{CarryOut}$ remains unchanged at the low voltage level during the first driving period Tri_P1.

When the pulse of the clock signal CLK3 received at the clock input terminal CK2 of the first control unit 320 arrives, the transistor T7 is turned on, which pulls up the voltages at the node N3 and the output terminal OUT2 to a high voltage level approaching the supply voltage VH, thus ending the first driving period Tri_P1. In other words, in the embodiment of the invention, the first driving period Tri_P1 begins when the input terminal IN receives a pulse and ends when the clock input terminal CK2 receives a pulse.

In addition, when the pulse of the clock signal CLK3 received at the clock input terminal CK2 of the first control unit 320 arrives, the voltage level at the node N2 is pulled low due to the turning on of the transistors T5 and T6. Thus, the transistors T1, T2 and T3 are turned off and the output terminal OUT1 returns to a high impedance state (that is, as in an open circuit status).

After the end of the first driving period Tri_P1, the transistor T1 of the first control unit 320 and the second control unit 330 are turned off. That is, the nodes N1 and N2 are at a low voltage level, the output terminal OUT1 has high impedance and the node N3 and the output terminal OUT2 are at a high voltage level until a pulse of the gate driving signal G(N) arrives to begin the second driving period Tri_P2.

When the pulse of the gate driving signal G(N) arrives, the transistor T4 of the second control unit 330 is turned on and the second driving period Tri_P2 begins. When the transistor T4 is turned on, a voltage level at the node N2 is pulled high to a high voltage approaching the supply voltage VH, turning on the transistors T2 and T8. Next, a voltage level at the node N1 is pulled high to a high voltage approaching the supply voltage VH, turning on the transistors T1 and T3. Meanwhile, voltages at the node N3 and the output terminal OUT2 are pulled low to a low voltage level approaching the supply voltage VL due to the turning on of the transistor T8 and thus the transistors T5 and T6 are turned off.

Since the control unit receiving the gate driving signal G(N) is the second control unit 330, the output terminal OUT2 is coupled to the node FW. Therefore, as shown in FIG. 7, during the second driving period Tri_P2, the voltage at the node is pulled low to a low voltage level.

When the transistor T1 of the second control unit 330 is turned on, the clock signal received at the clock input terminal CK1 is output to the output terminal OUT1 as the carryout signal $S_{CarryOut}$. As shown in FIG. 3, the clock signal received at the clock input terminal CK1 of the second control unit 330 is CLK1. Note that since the clock signal CLK1 is designed to have a pulse during the second driving period Tri_P2, a voltage level of the carryout signal $S_{CarryOut}$ will change in response to the change in the clock signal CLK1 and a pulse is therefore generated. In this manner, the pulse in the carryout signal $S_{CarryOut}$ is successfully generated after the end of the forward scan.

In the embodiments of the invention, the second driving period Tri_P2 begins when the input terminal IN receives a pulse and ends when the clock input terminal CK2 receives a pulse. For example, in this embodiment, since the clock signal received at the clock input terminal CK2 of the second control unit 330 is CLK2, the second driving period Tri_P2 ends when a pulse of the clock input terminal CLK2 arrives.

Referring to FIG. 8, during the reverse scan, the timings of the clock signals CLK1~CLK4 are reversed. Therefore, the gate driving unit 310 sequentially outputs the gate driving signals G(N)~G(1). Since the control unit receiving the gate driving signal G(N) is the second control unit 330, the output terminal OUT2 thereof is coupled to the node FW. Therefore, as shown in FIG. 8, during the reverse scan, a voltage at the node FW is pulled low to a low voltage level during the first driving period Tri_P1 and is pulled high to a high voltage level in the remaining time other than the first driving period Tri_P1 as discussed above.

Note that during the first driving period Tri_P1, the clock signal received at the clock input terminal CK1 of the second control unit 330 is output to the output terminal OUT1 as the carryout signal $S_{CarryOut}$. As shown in FIG. 3, the clock signal received at the clock input terminal CK1 of the second control unit 330 is CLK1. Since the clock signal CLK1 is designed not to have a pulse during the first driving period Tri_P1, the voltage level of the carryout signal $S_{CarryOut}$ remains unchanged at the low voltage level during the first driving period Tri_P1.

On the other hand, since the control unit receiving the gate driving signal G(1) is the first control unit 330, the output terminal OUT2 thereof is coupled to the node BW. Therefore, as shown in FIG. 8, during the reverse scan, the voltage at the node BW is pulled low to a low voltage level during the second driving period Tri_P2 and is pulled high to a high voltage level in the remaining time other than the second driving period Tri_P2 as discussed above.

Note that during the second driving period Tri_P2, the clock signal received at the clock input terminal CK1 of the first control unit 320 is output to the output terminal OUT1 as the carryout signal $S_{CarryOut}$. As shown in FIG. 3, the clock signal received at the clock input terminal CK1 of the first control unit 320 is CLK4. Since the clock signal CLK4 is designed to have a pulse during the second driving period Tri_P2, the voltage level of the carryout signal $S_{CarryOut}$ changes and a pulse is therefore generated. In this manner, the pulse in the carryout signal $S_{CarryOut}$ is successfully generated after the end of the reverse scan.

Note that although the transistors shown in FIG. 5 are all NMOS transistors, the invention should not be limited thereto. For example, as long as the control signals (such as the start pulse SP, the clock signals CLK1~CLK4 . . . etc.) are changed from active high to active low, the transistors shown in FIG. 5 can be replaced by PMOS transistors. When the transistors shown in FIG. 5 are replaced by PMOS transistors, the corresponding signal waveforms can be easily derived by only reversing the signal waveforms shown in FIG. 7 and FIG. 8.

In addition, the proposed control units (for example, the first control unit and the second control unit) are not limited to be implemented by all PMOS or all NMOS transistors, and can be implemented by CMOS transistors.

Figure 6:
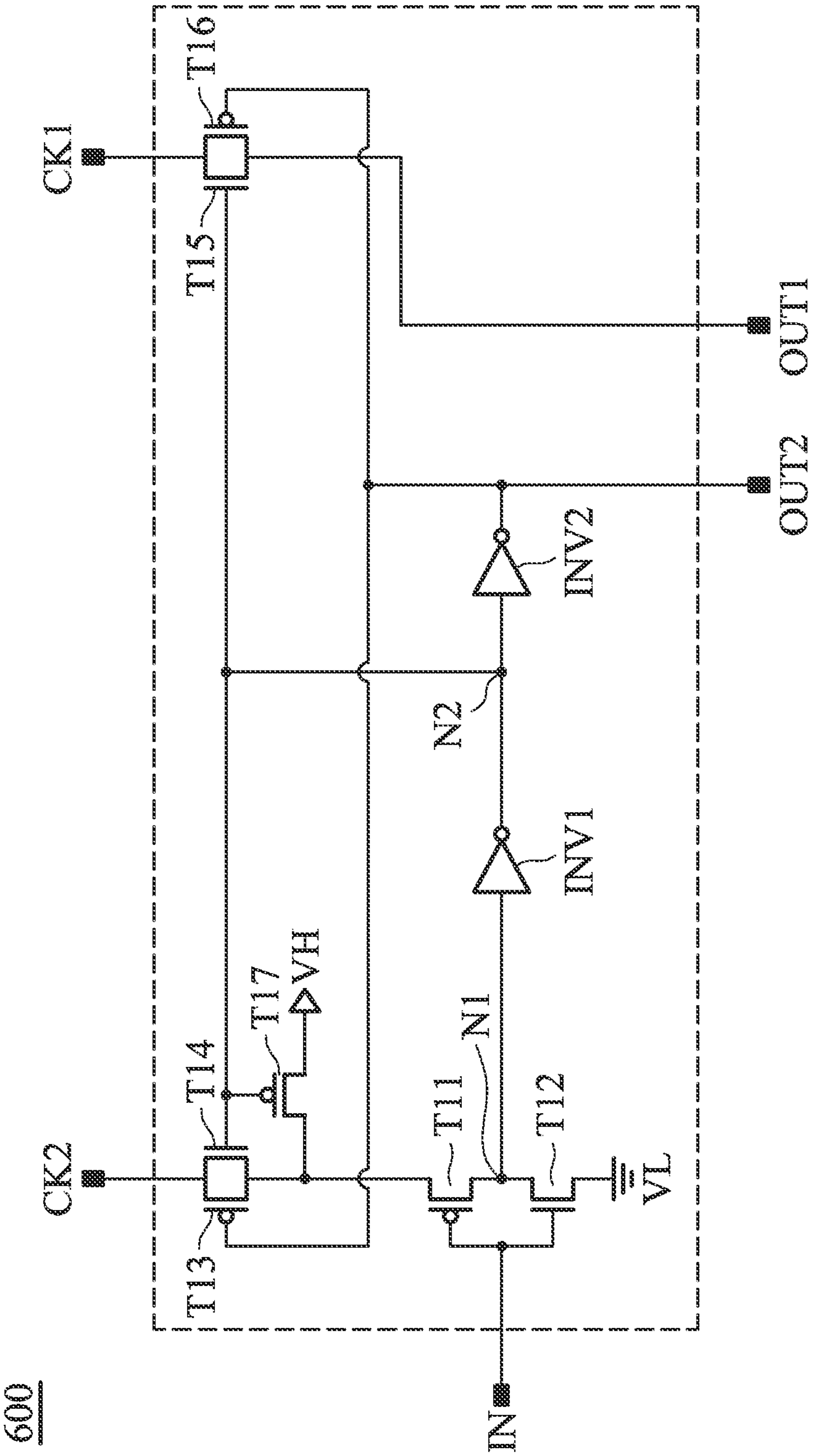
FIG. 6 shows an exemplary circuit diagram according to another embodiment of the invention.

FIG. 6 shows an exemplary circuit diagram according to another embodiment of the invention, wherein the control unit 600 may be the first control unit 320 and/or the second control unit 330 as shown in FIG. 3. The control unit 600 may comprise transistors T11~T17 and inverters INV1 and INV2. The transistors T11 and T12 are coupled between the node N1 and the input terminal IN. The inverters INV1 and INV2 are coupled in serial between the node N1 and the output terminal OUT2. The transistors T13 and T14 are coupled between the clock input terminal CK2 and the transistor T11. The transistors T15 and T16 are coupled between the clock input terminal CK1 and the output terminal OUT1. The transistor T17 is coupled between the supply voltage VH and the transistor T14.

In the initial state of the control unit 600 and before a pulse arrives at the input terminal IN of the control unit, the node N is at a low voltage level and the output terminal OUT2 is at a high voltage level. Meanwhile, the transistors T17 and T11 are turned on such that a voltage level at the output terminal OUT2 remains at a high voltage level.

When the control unit 600 receives a pulse at the input terminal IN, the transistor T12 is turned on and thus the node N1 and the output terminal OUT2 are at a low voltage level. Meanwhile, the node N2 is at a high voltage level and thus the transistors T14 and T15 are turned on. Therefore, the clock signal received at the clock input terminal CK1 is output to the output terminal OUT1 as the carryout signal $S_{CarryOut}$.

Figure 9:
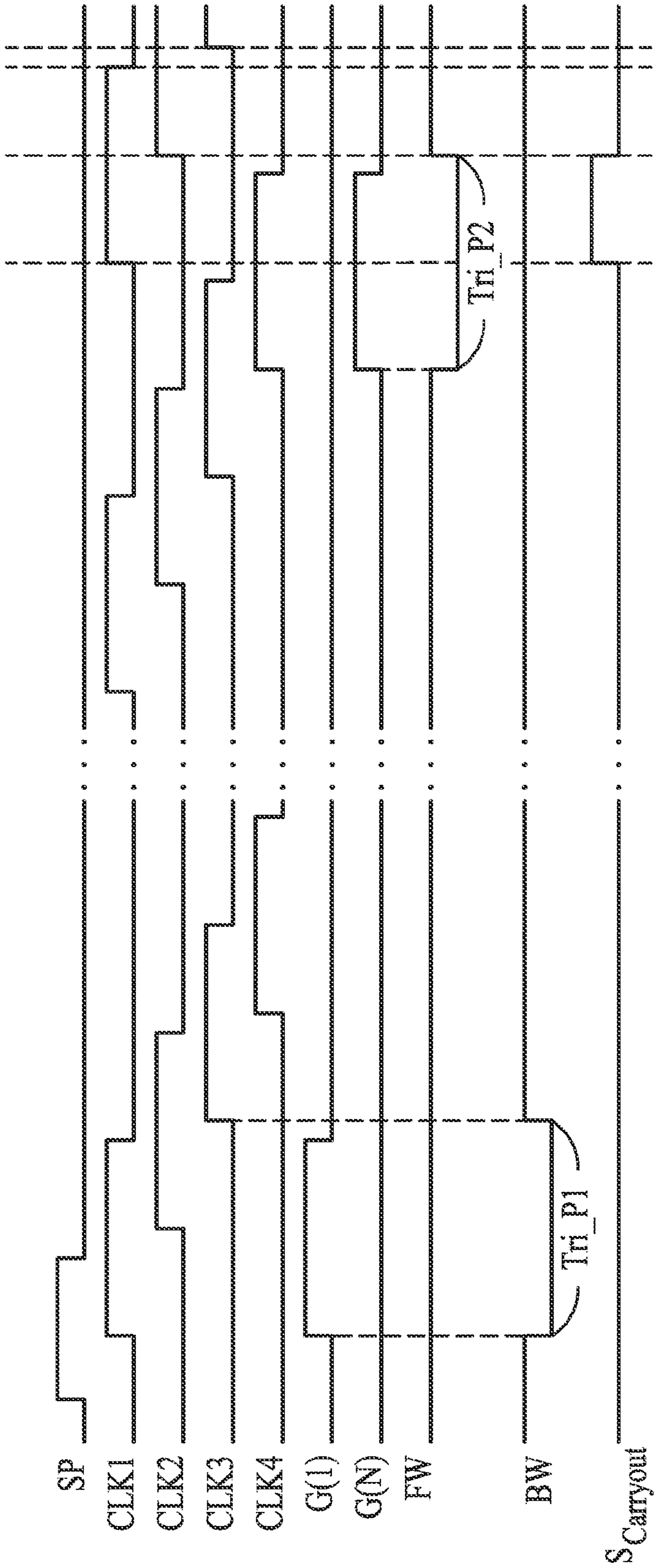
FIG. 9 shows signal waveforms of the gate driving device in forward scan according to another embodiment of the invention.
Figure 10:
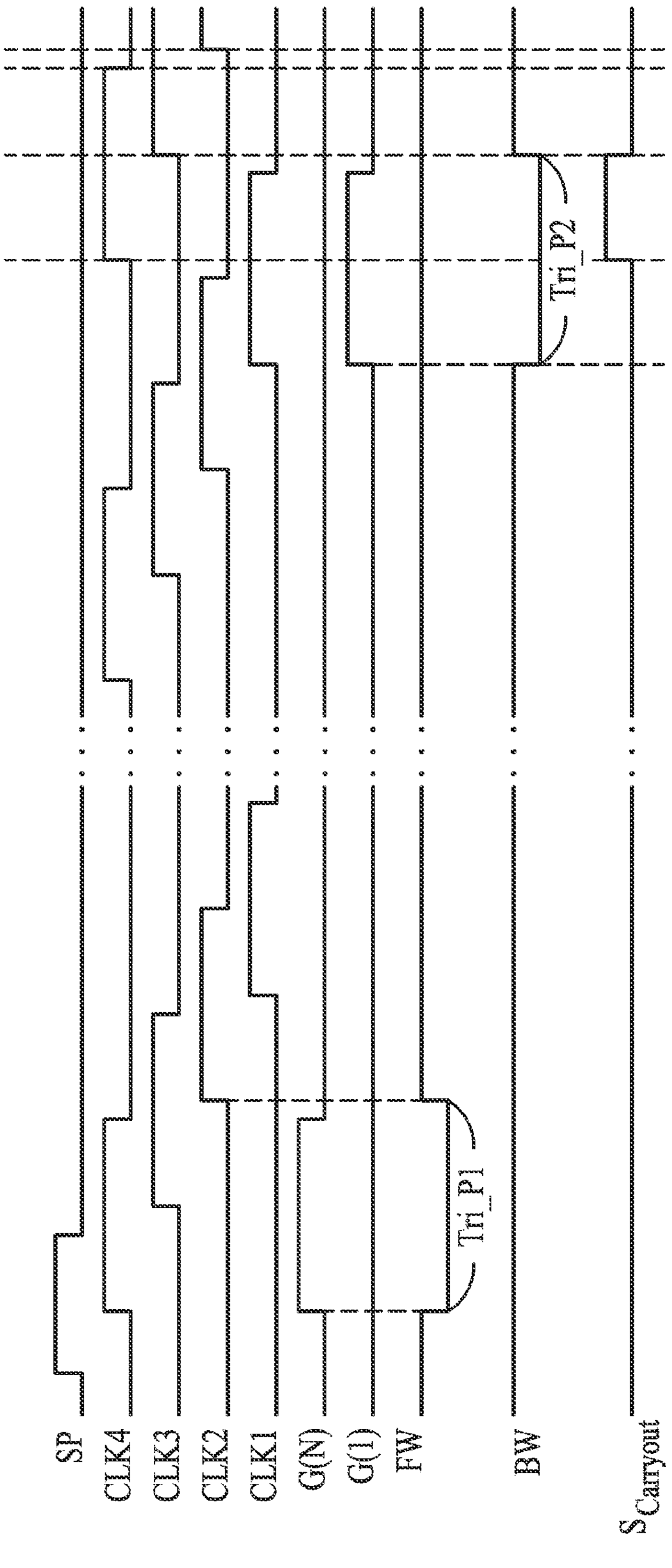
FIG. 10 shows signal waveforms of the gate driving device in reverse scan according to another embodiment of the invention.

FIG. 9 shows signal waveforms of the gate driving device in forward scan according to another embodiment of the invention. FIG. 10 shows signal waveforms of the gate driving device in reverse scan according to another embodiment of the invention. The waveforms shown in FIG. 9 and FIG. 10 are similar to that in FIG. 7 and FIG. 8, and different in that the waveforms of the clock signals overlap with each other. Therefore, in FIG. 9 and FIG. 10, the pulse width of the start pulse SP and the gate driving signals G(1)~G(N) are wider than that in FIG. 7 and FIG. 8. For the descriptions regarding the waveforms shown in FIG. 9 and FIG. 10, reference may be made to the descriptions for FIG. 7 and FIG. 8 and are omitted here for brevity. Note that the waveforms as shown in FIG. 7~FIG. 10 are all applicable in the embodiment of the control unit 600 shown in FIG. 6.

Use of ordinal terms such as “first”, “second”, “third”, etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

While the invention has been described by way of example and in terms of preferred embodiment, it is to be understood that the invention is not limited thereto. Those who are skilled in this technology can still make various alterations and modifications without departing from the scope and spirit of this invention. Therefore, the scope of the present invention shall be defined and protected by the following claims and their equivalents.

What is claimed is:

1. A gate driving device, comprising:

a gate driving unit, comprising a bi-directional shift register circuit for generating a plurality of gate driving signals according to a start pulse to drive a plurality of pixels in a pixel array, wherein the bi-directional shift register circuit comprises 1~N stages of shift registers coupled in serial, and N is a positive integer, a first stage shift register generates a first output signal and an N-th stage shift register generates a second output signal;

a first control unit, coupled to the gate driving unit and comprising an input terminal receiving the first output signal of the gate driving unit and a first clock input terminal receiving a first clock signal;

a second control unit, coupled to the gate driving unit and comprising an input terminal receiving the second output signal of the gate driving unit and a first clock input terminal receiving a second clock signal; and a switch unit, coupled to the first control unit and the second control unit at a carryout signal output node, wherein the first control unit and the second control unit generates a carryout signal at the carryout signal output node according to the first output signal and the second output signal.

2. The gate driving device as claimed in claim 1, wherein the first control unit further comprises:

a second clock input terminal, for receiving a third clock signal;

a first output terminal, coupled to the carryout signal output node; and a second output terminal, coupled to a first control node, and wherein the second control unit further comprises:

a second clock input terminal, for receiving a fourth clock signal;

a first output terminal, coupled to the carryout signal output node; and a second output terminal, coupled to a second control node.

3. The gate driving device as claimed in claim 2, wherein the switch unit comprises:

a first switch, coupled to the first control node and switching on or off in response to a voltage at the first control node; and a second switch, coupled to the second control node and switching on or off in response to a voltage at the second control node, wherein the first switch and the second switch are coupled in serial between the carryout signal output node and a first supply voltage.

4. The gate driving device as claimed in claim 1, wherein when the gate driving unit outputs the gate driving signals in a first order, the first control unit generates the carryout signal according to the first clock signal during a first driving period, and the second control unit generates the carryout signal according to the second clock signal during a second driving period later than the first driving period.

5. The gate driving device as claimed in claim 1, wherein a voltage of the carryout signal remains unchanged during the first driving period and changes during the second driving period.

6. The gate driving device as claimed in claim 1, wherein when the gate driving unit outputs the gate driving signals in a second order reverse to the first order, the second control unit generates the carryout signal according to the second clock signal during a first driving period, and the first control unit generates the carryout signal according to the first clock signal during a second driving period later than the first driving period, wherein a voltage of the carryout signal remains unchanged during the first driving period and changes during the second driving period.

7. The gate driving device as claimed in claim 4, wherein during the first driving period, the first control unit outputs the first clock signal at the first output terminal as the carryout signal, and the second output terminal of the first control unit is coupled to a first supply voltage, such that the first control node has a first voltage level, and in the remaining time other than the first driving period, the second output terminal of the first control unit is coupled to a second supply voltage, such that the first control node has a second voltage level.

8. The gate driving device as claimed in claim 4, wherein during the second driving period, the second control unit outputs the second clock signal at the first output terminal as the carryout signal and the second output terminal of the second control unit is coupled to a first supply voltage, such that the second control node has a first voltage level, and in the remaining time other than the second driving period, the second output terminal of the second control unit is coupled to a second supply voltage, such that the second control node has a second voltage level.

9. The gate driving device as claimed in claim 3, wherein when the first switch and the second switch are simultaneously turned on, the carryout signal output node is electronically connected to a first supply voltage, such that the carryout signal has a first voltage level.

10. A gate driving device, comprising:

a gate driving unit, generating a plurality of gate driving signals according to a start pulse to drive a plurality of pixels in a pixel array, comprising:

a first input terminal, receiving the start pulse;

a second input terminal, receiving the start pulse;

a first output terminal, outputting a first output signal; and a second output terminal, outputting a second output signal;

a first control unit, comprising an input terminal coupled to the first output terminal of the gate driving unit for receiving the first output signal and a first clock input terminal for receiving a first clock signal; and a second control unit, comprising an input terminal coupled to the second output terminal of the gate driving unit for receiving the second output signal and a first clock input terminal for receiving a second clock signal, wherein the first control unit and the second control unit are further coupled to a carryout signal output node and generate a carryout signal at the carryout signal output node according to the first output signal and the second output signal, and wherein when the gate driving unit outputs the gate driving signals in a first order, the first control unit generates the carryout signal according to the first clock signal during a first driving period, and the second control unit generates the carryout signal according to the second clock signal during a second driving period later than the first driving period.

11. The gate driving device as claimed in claim 10, wherein a voltage of the carryout signal remains unchanged during the first driving period and changes during the second driving period.

12. The gate driving device as claimed in claim 10, wherein when the gate driving unit outputs the gate driving signals in a second order reverse to the first order, the second control unit generates the carryout signal according to the second clock signal during the first driving period, and the first control unit generates the carryout signal according to the first clock signal during the second driving period later than the first driving period, and wherein a voltage of the carryout signal remains unchanged during the first driving period and changes during the second driving period.

13. The gate driving device as claimed in claim 10, wherein the first control unit further comprises:

a second clock input terminal, for receiving a third clock signal;

a first output terminal, coupled to the carryout signal output node; and a second output terminal, coupled to a first control node, and wherein the second control unit further comprises:

a second clock input terminal, for receiving a fourth clock signal;

a first output terminal, coupled to the carryout signal output node; and a second output terminal, coupled to a second control node.

14. The gate driving device as claimed in claim 13, further comprising:

a switch unit, comprising:

a first switch, coupled to the first control node and switching on or off in response to a voltage at the first control node; and a second switch, coupled to the second control node and switching on or off in response to a voltage at the second control node.

15. The gate driving device as claimed in claim 14, wherein the first switch and the second switch are coupled in serial between the carryout signal output node and a first supply voltage.

16. The gate driving device as claimed in claim 13, wherein during the first driving period, the first control unit generates the first clock signal at the first output terminal as the carryout signal, and the second output terminal of the first control unit is coupled to a first supply voltage, such that the first control node has a first voltage level.

17. The gate driving device as claimed in claim 16, wherein in the remaining time other than the first driving period, the first output terminal of the first control unit has high impedance and the second output terminal of the first control unit is coupled to a second supply voltage, such that the first control node has a second voltage level.

18. The gate driving device as claimed in claim 13, wherein during the second driving period, the second control unit outputs the second clock signal at the first output terminal as the carryout signal and the second output terminal of the second control unit is coupled to a first supply voltage, such that the second control node has a first voltage level.

19. The gate driving device as claimed in claim 18, wherein in the remaining time other than the second driving period, the first output terminal of the second control unit has high impedance and the second output terminal of the second control unit is coupled to a second supply voltage, such that the second control node has a second voltage level.

20. The gate driving device as claimed in claim 15, wherein when the first control node and the second control node have the same voltage level, the carryout signal output node is electronically connected to the first supply voltage, such that the carryout signal has a first voltage level.

* * * * *